United States Patent
Budraa et al.

(10) Patent No.: US 7,985,657 B1
(45) Date of Patent: Jul. 26, 2011

(54) SYSTEMS AND METHODS FOR BONDING MATERIALS USING MICROWAVE ENERGY

(75) Inventors: Nasser K. Budraa, La Crescenta, CA (US); Boon Ng, Alhambra, CA (US)

(73) Assignee: Microwave Bonding Instruments, Inc., Arcadia, CA (US)

( * ) Notice: Subject to any disclaimer, the term of this patent is extended or adjusted under 35 U.S.C. 154(b) by 634 days.

(21) Appl. No.: 11/684,553

(22) Filed: Mar. 9, 2007

Related U.S. Application Data

(63) Continuation-in-part of application No. 11/551,915, filed on Oct. 23, 2006.

(60) Provisional application No. 60/730,076, filed on Oct. 24, 2005, provisional application No. 60/781,390, filed on Mar. 10, 2006.

(51) Int. Cl.
*H01L 21/30* (2006.01)

(52) U.S. Cl. .......... 438/455; 257/E21.567; 257/E21.122

(58) Field of Classification Search .......... 438/455–457, 438/118, 119; 257/E21.529, E21.567, E21.122, 257/E21.088, E23.023, E27.137, E27.144, 257/E27.161
See application file for complete search history.

(56) References Cited

U.S. PATENT DOCUMENTS

| | | | | |
|---|---|---|---|---|
| 4,962,000 | A * | 10/1990 | Emslander et al. | 428/461 |
| 6,054,693 | A * | 4/2000 | Barmatz et al. | 219/678 |
| 6,057,212 | A * | 5/2000 | Chan et al. | 438/455 |
| 6,239,484 | B1 * | 5/2001 | Dore et al. | 257/687 |
| 6,469,324 | B1 * | 10/2002 | Wang | 257/98 |
| 2002/0182479 | A1 * | 12/2002 | Mallari et al. | 429/44 |
| 2003/0121958 | A1 * | 7/2003 | Ratificar et al. | 228/246 |
| 2004/0084444 | A1 * | 5/2004 | Wang et al. | 219/679 |
| 2005/0238312 | A1 * | 10/2005 | Meder et al. | 385/137 |
| 2005/0266670 | A1 * | 12/2005 | Lin et al. | 438/613 |
| 2006/0038189 | A1 * | 2/2006 | Coffey et al. | 257/88 |
| 2006/0199353 | A1 * | 9/2006 | Kub et al. | 438/455 |
| 2006/0289992 | A1 * | 12/2006 | Wood | 257/738 |
| 2007/0108195 | A1 * | 5/2007 | Tian et al. | 219/702 |
| 2007/0246514 | A1 * | 10/2007 | Lettner et al. | 228/177 |
| 2009/0223705 | A1 * | 9/2009 | Yamashita et al. | 174/260 |

* cited by examiner

*Primary Examiner* — Matthew C Landau
*Assistant Examiner* — Latanya Crawford

(57) ABSTRACT

Systems and methods are disclosed for bonding of semiconductor, metal, metal-ceramic or combinations of these substrates using microwave energy. In some embodiments, metal-ceramic substrates carrying semiconductor substrates can be bonded simultaneously through a thin interlayer metal to a metal substrate by using microwave energy. In some embodiments, other substrate combinations can be bonded by using microwave energy. High intensity microwave energy is applied to the substrate assembly positioned within a microwave cavity. A process of selective heating can occur in the thin interlayer metal enhanced by the presence of third microwave absorbing substrate, resulting in melting of the thin interlayer metal to facilitate bonding of the two substrates. Some of the advantages associated with such bonding process are disclosed.

8 Claims, 8 Drawing Sheets

SYSTEMS AND METHODS FOR BONDING MATERIALS USING MICROWAVE ENERGY

CROSS-REFERENCE TO RELATED APPLICATIONS

This application is a continuation-in-part application of U.S. patent application Ser. No. 11/551,915 filed Oct. 23, 2006 and titled "SYSTEMS AND METHODS FOR BONDING SEMICONDUCTOR SUBSTRATES TO METAL SUBSTRATES USING MICROWAVE ENERGY" which claims the benefit of Provisional U.S. Patent Application No. 60/730,076 filed Oct. 24, 2005 titled "SYSTEMS AND METHODS FOR BONDING SEMICONDUCTOR SUBSTRATES TO METAL SUBSTRATES USING MICROWAVE ENERGY" the entire contents of which are incorporated herein by reference and should be considered a part of this specification.

This application claims also the benefit of priority under 35 U.S.C. §119(e) of U.S. Provisional Application No. 60/781,390 filed on Mar. 10, 2006, entitled "SYSTEMS AND METHODS FOR BONDING METAL OR METAL-CERAMIC COMBINATION TO METAL SUBSTRATES USING MICROWAVE ENERGY", the entirety of which is incorporated herein by reference.

BACKGROUND OF THE INVENTION

1. Field of the Invention

The present disclosure generally relates to bonding technology, and more particularly, to systems and methods for bonding semiconductor-semiconductor, semiconductor-ceramic, semiconductor-metal, and/or metal-ceramic substrates using microwave energy. These combinations are used in semiconductor applications where some of these substrates could be carrying an electronic device.

2. Description of the Related Art

Various devices have separate parts that are bonded together to gain more utility. For example, in many applications, different substrates are bonded together by interlayers in order to achieve higher capabilities. In an alternative example, electronic components are bonded ("interconnected") to electrical pathways to allow communication between the electrical components.

Conventional techniques for bonding substrates and forming interconnections, however, rely upon the use of elevated temperatures which may lead to problems, including premature failures and reliability concerns.

In one example, conventional substrate bonding can result in bulk heating of one or more of the substrates. Owing to differences in the coefficient of thermal expansion of the substrates, residual stresses may then arise during and/or after the bonding process. Furthermore, the bulk heating of the substrates during the bonding process may result in undesirable diffusion of dopant materials into the substrates. These residual stresses and dopants may result in premature failure of the bond.

In another example, conventional substrate bonding can also limit the maximum bond strength when a low-melting-temperature interlayer material is used.

Conventional techniques for forming electrical interconnections, or interconnects, are also problematic in the presence of low melting point materials such as packaging materials. The typical solders used for interconnects are often re-shaped at elevated temperature after initial deposition. Bulk heating of the region about the interconnects may result in undesirable degradation, migration, and/or loss of the packaging layer adjacent the interconnects.

From the foregoing, then, there is a need for improved systems and methods for bonding components such as substrates and electrical interconnects.

SUMMARY OF THE INVENTION

Embodiments of the present disclosure provide a method for bonding substrates. The method comprises providing a first substrate, a second substrate, and a third substrate. The first and second substrates are positioned adjacent to each other and a third substrate is positioned proximate to at least one of the first and second substrates. The method further comprises providing an interlayer interposed between the first and second substrates. The method additionally comprises providing microwave energy incident upon the substrates and the interlayer such that at least a portion of the microwave energy is absorbed by the interlayer to thereby raise the temperature of the interlayer. The interlayer is configured such that the temperature of the interlayer increases faster than that of the first and second substrates so as to melt the interlayer and thereby facilitate bonding of the first and second substrates.

In one embodiment, at least a portion of the microwave energy is absorbed by the third substrate to thereby raise the temperature of the interlayer.

In one embodiment, the method further comprises interposing a second interlayer between the third substrate and one of the first and second substrates.

In one embodiment, the interlayer comprises a metal layer having a heat capacity less than that of the first and second substrates. In one embodiment, the metal interlayer comprises a thin film metal which, initially, is substantially not interconnected with either of the first and second substrates. In one embodiment, the metal interlayer comprises a surface coating formed on one at least one of the first and second substrates.

In one embodiment, the first and second substrates are independently selected from metals, metal-ceramic combinations, and semiconductors. In one embodiment, the third substrate is selected from semiconductors and polymers In one embodiment, the method further comprises providing a force that facilitates parts intimacy for the first and second substrates with the interlayer interposed there between. In one embodiment, the method additionally comprises monitoring the force so as to allow detection of a melt point of the interlayer.

Another embodiment of the present disclosure provides a system for bonding substrates. The system comprises a substrate assembly comprising an interlayer between a first substrate and a second substrate and a third substrate proximate to one of the first and second substrates. The system further comprises a microwave cavity dimensioned to receive the substrate assembly such that microwave energy can be applied to the substrate assembly so that at least a portion of the microwave energy is absorbed by the interlayer to thereby raise the temperature of the interlayer. The interlayer is configured such that the temperature of the interlayer increases faster than that of the first and second substrates and melts to thereby facilitate bonding of the first and second substrates.

In one embodiment, at least a portion of the microwave energy is absorbed by the third substrate to thereby raise the temperature of the interlayer.

In one embodiment, the method further comprises interposing a second interlayer between the third substrate and one of the first and second substrates.

In one embodiment, the interlayer comprises a metal layer having a heat capacity less than that of the first and second substrates. In one embodiment, the metal layer is comprises a thin-film metal that, initially, is substantially not attached to the first or second substrate. In one embodiment, the metal layer comprises a surface coating formed on one of the first and second substrate.

In one embodiment, the first and second substrates are independently selected from metals, metal-ceramic combinations, and semiconductors. In one embodiment, the third substrate is selected from semiconductors and polymers.

In one embodiment, the first substrate comprises one of a metal, metal-ceramic combination, and semiconductor which carries semiconductor electronics and the second substrate comprises a metal substrate. In one embodiment, the third substrate comprises a semiconductor.

In one embodiment, the system further comprises a pressure applicator configured to provide a force that facilitates parts intimacy for the substrate assembly. In one embodiment, the system further comprises an endpoint component configured to detect a melt point of the interlayer.

In the foregoing embodiments and other embodiments of the present disclosure, the interlayer can be formed from metals and metal alloys such as Au, AuSn, AuBe, InSn, In, AuSn, AuGe, AuNi, AuZn, substantially lead-free Sn—Ag—Cu alloys, and solders. The thin film metal may have a thickness in the range of approximately 3 to 50 microns. The surface coating interlayer may have a thickness in the range of approximately 0.1 to 3 microns.

In the foregoing embodiments, and other embodiments of the present disclosure, the metals that may be used for the first and second substrates include, but are not limited to, copper (Cu), molybdenum (Mo), tungsten (W), chrome, aluminum (Al), platinum-titanium (Pt—Ti), and combinations, such as CuMo, AlSiC. In some embodiments, metals and ceramics which may be used for embodiments of the first and second substrates 102, 104 comprising metal-ceramic combinations include, but are not limited to, copper, molybdenum, tungsten, chrome, aluminum, platinum-titanium, alumina, and combinations such as Cu-Alumina-Cu known as 'Direct Copper Bonding or DCB', CuMo, AlSiC. In some embodiments, the semiconductors which may be used for the first, second, and third substrates may include, but are not limited to, silicon, sapphire, quartz, alumina, gallium arsenide, gallium nitride and III-V and II-VI semiconducting materials.

BRIEF DESCRIPTION OF THE DRAWINGS

These and other aspects, advantages, and novel features of the present teachings will become apparent upon reading the following detailed description and upon reference to the accompanying drawings. In the drawings, similar elements have similar reference numerals.

DETAILED DESCRIPTION OF THE PREFERRED EMBODIMENT

Embodiments of the present disclosure generally relate to systems and methods for bonding materials together. In certain embodiments, systems and methods for bonding substrates interposed by interlayers using microwave energy upon are provided.

Figure 1A:
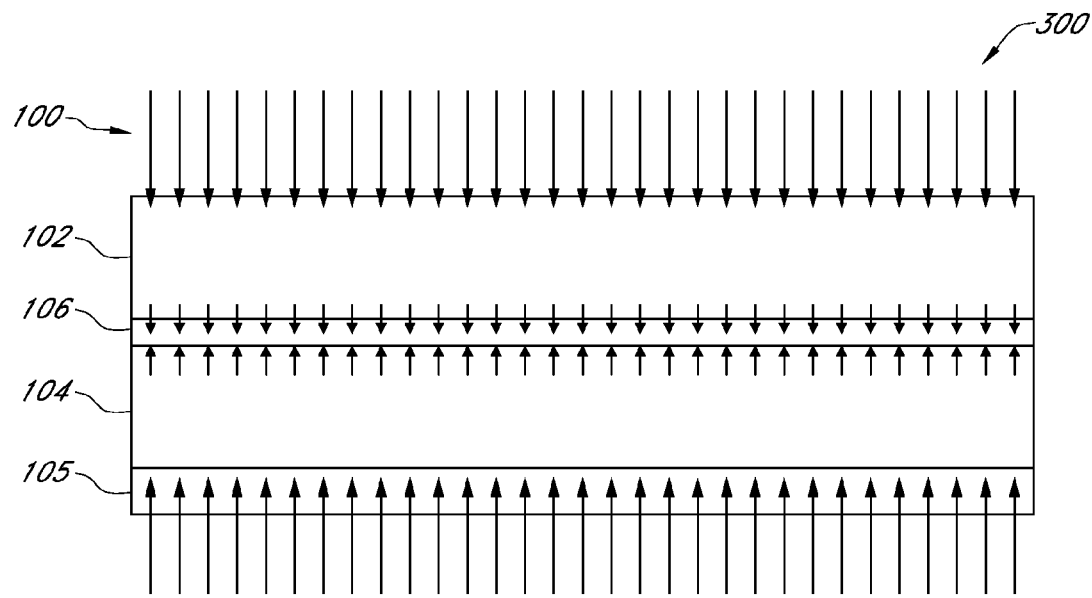
FIG. 1A shows one embodiment of a bonding situation where a single interlayer is interposed between a first substrate and a second substrate. A third substrate absorbs at least a portion of the microwaves to accelerate the heating, where microwave energy heats the interlayer in a localized manner.

FIG. 1A shows one embodiment of an assembly 300 that includes a first substrate 104 bonded with a second substrate 102 via an interlayer 106 interposed there between. In one embodiment, a third substrate 105 is positioned proximate to at least one of the first and second substrates 102, 104. For example, as illustrated in FIGS. 1A-1D, the third substrate 105 is positioned proximate to the first substrate 104. In alternative embodiments (not pictured), a third substrate 105 may be positioned proximate to the second substrate 102. In further alternative embodiments, two third substrates 105 may be positioned proximate to each of the first and second substrates 102, 104.

In general, the assembly 300 is configured so as to allow for substantially localized heating of the interlayer 106 by microwaves 100, while substantially minimizing the bulk heating of at least the first and second substrates 104, 102. In one advantage, the likelihood of developing residual stresses during bonding of the first and second substrate materials 104, 102 can be reduced when electromagnetic energy in the form of microwaves is applied over a relatively short duration to the localized region of the interlayer 106. In another advantage, providing a relatively high temperature to a localized region may reduce the total amount of energy employed in the bonding process.

As described in greater detail below, the first and second substrates 104, 102 may be formed from metals, metal-ceramic combinations, and semiconductors, while the third substrate 105 may be formed from a semiconductor or a polymer. In certain preferred embodiments, the third substrate 105 may comprise a doped-semiconductor such as silicon (Si). Advantageously, as discussed in greater detail below, the assembly 300 is configured such that the interlayer 106 heats faster than the first and second substrates 104, 102, when exposed to microwaves, allowing the interlayer 106 to melt and bond the two substrates 102, 104, even though very little microwave energy may be deposited in either or both of the substrates.

Figure 1B:
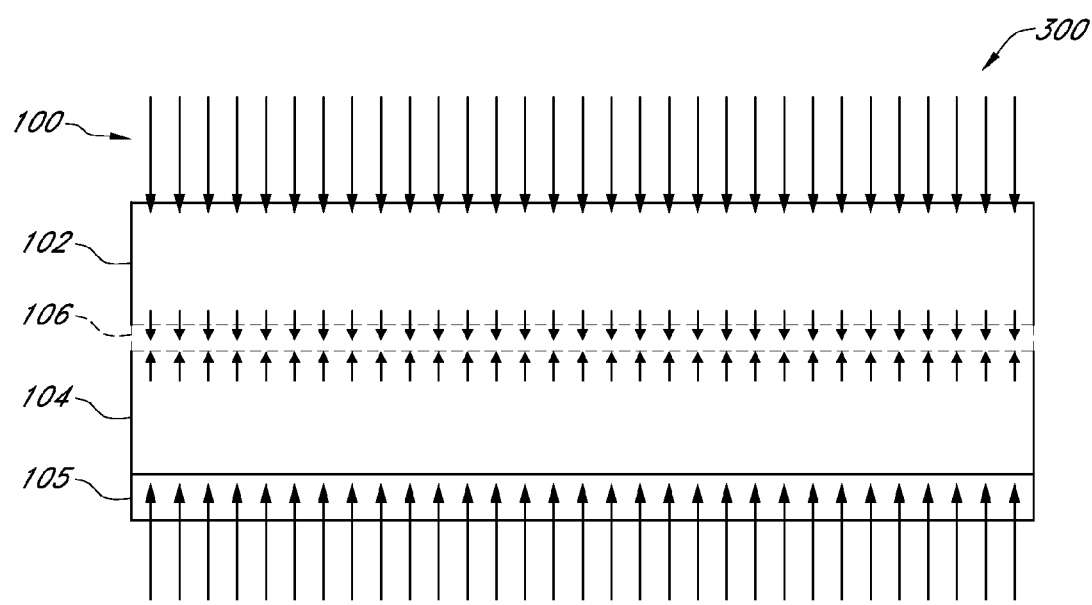
FIG. 1B shows the heated interlayer that facilitates bonding of the first and second substrates.

As illustrated in FIGS. 1A-1B, microwave energy 100 is applied to the assembly 300 to heat the interlayer 106. In one embodiment, a substantial portion of the microwave energy penetrates the interlayer 106, while the microwave energy 100 does not substantially penetrate the first and second substrates 104, 102 in a significant amount. With the foregoing application of the microwave energy 100, FIG. 1B shows the interlayer 106 being melted so as to bond the first and second substrates 102, 104 together.

The localized heating is accomplished due to the use of the microwaves 100. In general, microwaves are absorbed by materials to greater or lesser extent as the electromagnetic field of the microwaves penetrates the materials. The "loss tangent" of a material represents how much of the microwave energy will be absorbed by the material. In general, the greater the amount of microwave energy absorbed, the more heat generated within the material, and thus the greater the increase in temperature due to the absorption of microwave energy. As is generally known, heating of a given material can also depend on factors such as specific heat and the mass of the given material.

In one embodiment, the interlayer 106 comprises a metal. Within metals, absorption of the microwave energy 100 is generally limited to a "skin depth" that is very short. The skin depth is usually defined as the distance required for the power to be reduced to about 1/2.171800 (1/e, where is the natural logarithm), of the initial value at the surface. Thus, while metals in general have relatively high loss-tangent values, the absorption is limited to their skin depth. In some metals, the skin depth can range from approximately 0.05 to approximately 5 microns.

In certain embodiments, the metal interlayer has a relatively small thickness. Thus, the relatively small mass (and thus small heat capacity) of the metal interlayer can result in a rapid rise in temperature when subjected to microwaves. In one embodiment, the thickness of the metal interlayer can be selected so that absorption can occur within or about the interlayer.

In some embodiments, the third substrate 105 is formed from a semiconductor. In general, the loss tangent values for semiconductors are much smaller than that of metals, and can depend on the dopant content. Typical, the loss tangent of a semiconductor increases with temperature.

In some embodiments, the third substrate 105 can absorb at least a portion of the microwave energy incident on the assembly in order to facilitate heating and subsequent melting of the interlayer. The third substrate 105 may be used to accelerate the melting of the interlayer metal cases where the absorption of the microwaves 100 by the interlayer metal is not sufficiently rapid, such as when the interlayer metal is thick. Such bonding can be achieved, at least in part, because the interlayer has a relatively low heat capacity compared to the substrates. Advantageously, then, even though microwave energy is applied to both the interlayer and the substrates, the interlayer temperature rises substantially faster than that of the substrates. Thus, the metal interlayer melts while the temperature of the adjacent first and second substrates 104, 102 remain below the melting temperature of the interlayer metal.

Thus in some embodiments, bonding of the first and second substrates 104, 102 can be achieved by using a thin-film metal interlayer. Microwave energy results in significant heating within about the skin depth of the thin metal interlayer and, in some embodiments, the third substrate 105. The skin depth of the thin metal interlayer can be less than, substantially equal to, or greater than the thickness of the same. Because the thin metal interlayer has a higher loss tangent value than the semiconductors, metals, or metal-ceramic combinations which may comprises the first and second substrates 104, 102, and/or because the thin metal interlayer has a lower heat capacity than the first and second substrates 104, 102, the thin-film metal interlayer can heat up substantially faster than the first and second substrates 104, 102. Thus, by controlling the application of the microwave energy, the thin-film metal interlayer can be made to melt and bond the first and second substrates 104, 102 before the first and second substrates 104, 102 heat up to an undesirable level.

Figure 1C:
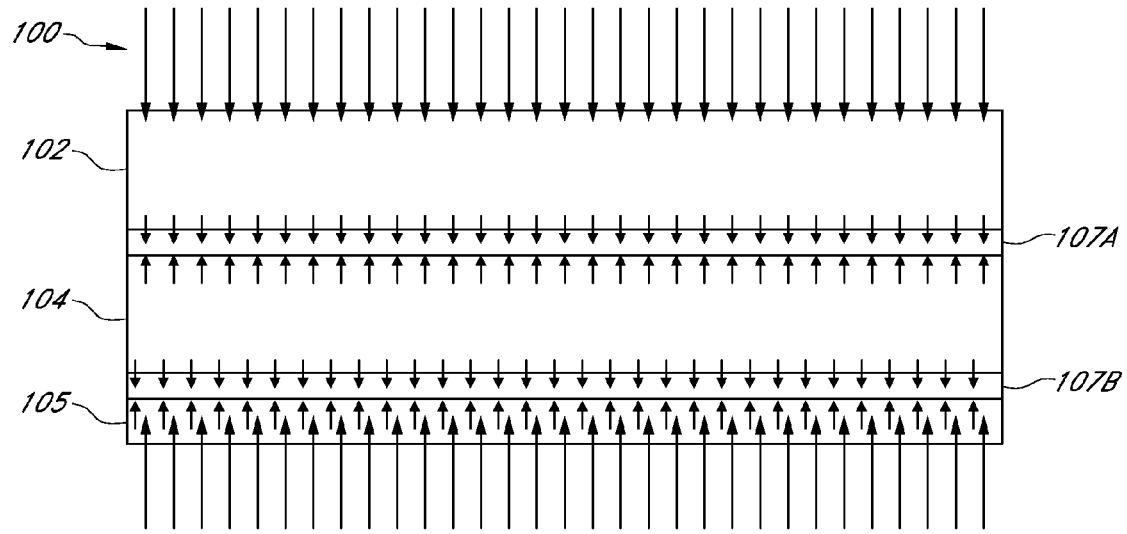
FIG. 1C shows one embodiment of a bonding situation where an interlayer is imposed both between the first and second substrates as well as the first and third substrates.
Figure 1D:
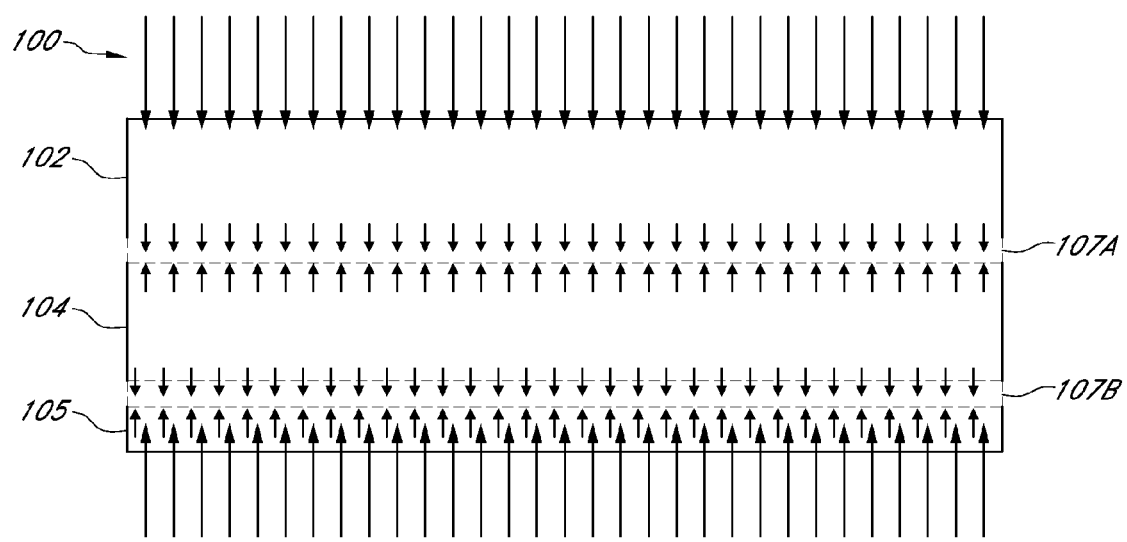
FIG. 1D shows the two heated interlayers that facilitate bonding of the first and second as well as first and third substrates.

FIGS. 1C-1D illustrate alternative embodiments of the assembly 300, represented as assembly 302. As illustrated in FIGS. 1C-1D, the assembly 302 may comprise first and second interlayers 107A, 107B positioned between the second and first substrates 104, 102 and the first and third substrates 104, 105, respectively. The interlayers 107A, 107B may be heated locally by microwaves 100 to allow bonding of the first and second substrates 104, 102 and first and third substrates 104, 105 in a similar manner as discussed with respect to the single interlayer 106 assembly 300. In the discussion below, single interlayer assemblies will be discussed. However, it may be understood that this disclosure may be similarly applied to assemblies comprising a plurality of interlayers such as interlayers 107A, 107B.

Figure 2A:
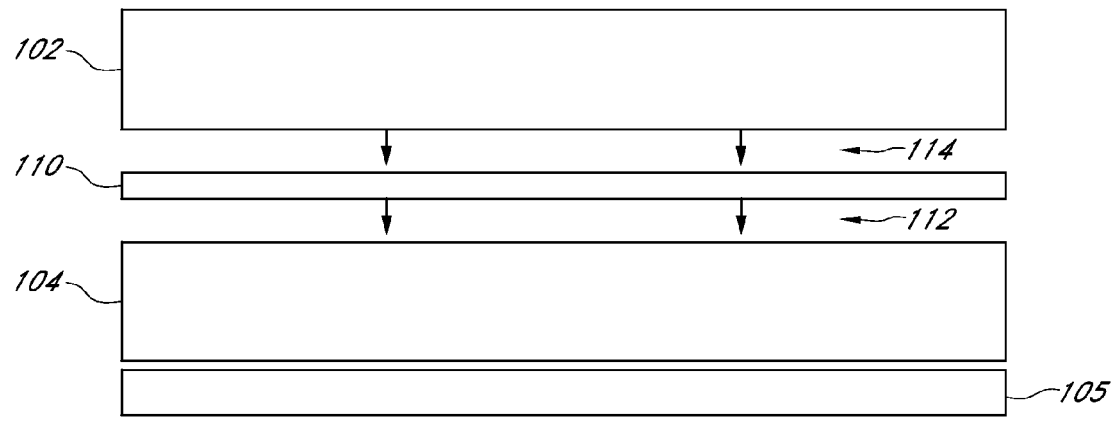
FIG. 2A shows that in one embodiment, the interlayer can be a preform layer that is not fixedly attached to any of the substrates prior to application of the microwave energy.
Figure 2B:
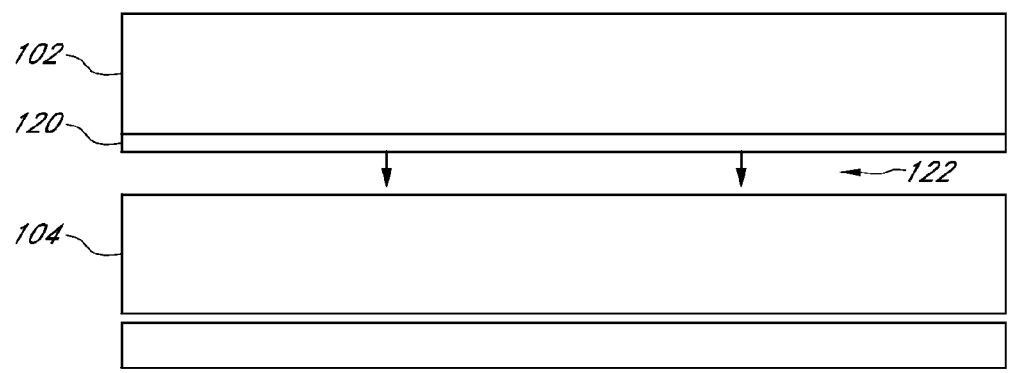
FIG. 2B shows that in one embodiment, the interlayer can be a coated layer on the surface of one or more surfaces of the substrates.
Figure 2C:
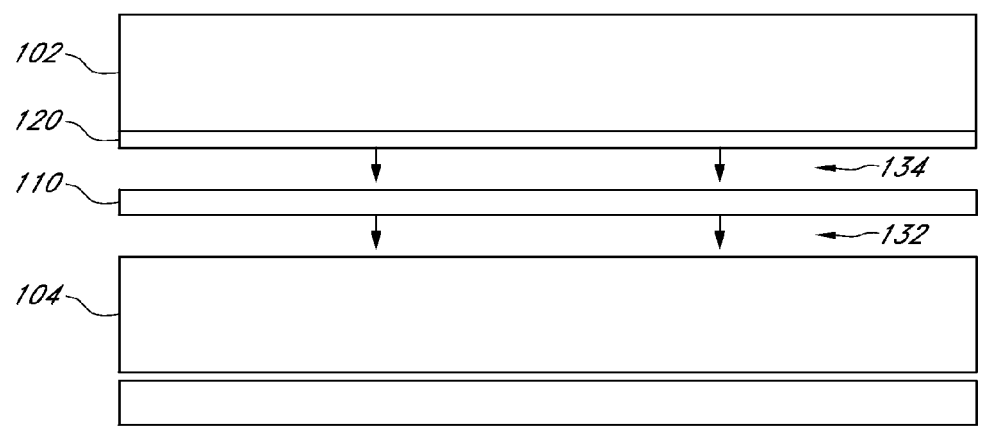
FIG. 2C shows that in one embodiment, the interlayer can be some combination of the embodiments of FIGS. 2A and 2B.

FIGS. 2A-2C show various embodiments of the interlayer that can be used to bond the various embodiments of the first and second substrates 104, 102. As shown in FIG. 2A, one embodiment of an interlayer can be a separate thin-film layer 110 that is initially (e.g. prior to use of microwaves) not substantially fixedly attached to the substrates 104, 102. Thus in one embodiment, the thin-film layer 110 can be positioned on the first substrate 104 (indicated by arrows 112), and the second substrate 102 can be positioned on the film-layer 110 (indicated by arrows 114). The resulting assembly can then be subjected to the microwave energy to bond the first and second substrates 104, 102 via melting of the thin-film layer 110 by the assistance of the third substrate 105.

FIG. 2B shows that in one embodiment, the interlayer can comprise a surface-coating 120 applied to either or both surfaces of the first and second substrates 104, 102. For example, the surface-coating 120 is depicted as being applied to the second substrate 102 prior to positioning the coated substrate (102 and 120) on the first substrate 104 (indicated by arrows 122).

FIG. 2C shows that in one embodiment, the interlayer can include some combination of the thin-film layer 110 and the surface-coating 120. For example, thin-film layer 110 is shown to be positioned on the first substrate 104 (indicated by arrows 132), and the second substrate 102 having the surface coating 120 is shown to be positioned on the thin-film layer 110 (indicated by arrows 134). In further embodiments, the surface coating may be positioned on both the first and second substrates 104, 102.

The composition and thickness of the interlayer can vary, depending on the type of application. In some embodiments, the thin-film interlayer 110 is formed from metal. In some embodiments, the surface coating 120 is formed from metal, and can be applied to the surface of one or more of the substrates 102, 104 using known techniques. In one embodiment, a gold metal surface coating 120 layer can be so deposited. Such surface coating may be, for example, approximately 1 micron in thickness. In some alternative embodiments, the thin film interlayer 110 and surface coating 120 may be independently selected from metals which may include, but are not limited to, Au, AuSn, AuBe, InSn, In, AuSn, AuGe, AuNi, AuZn, substantially lead-free Sn—Ag—Cu alloys, and solders.

In further embodiments, the surface coating 120 may be deposited upon an adhesion layer which is placed upon a diffusion barrier. The diffusion barrier inhibits the diffusion of the surface coating 120 into the substrates 102, 104, while the adhesion layer promotes the connection of the surface coating 120 to the diffusion barrier. Thus, the formation of mechanically weak alloy and intermetallic compositions may be inhibited. In one embodiment, the adhesion layer comprises a chrome adhesion layer and the diffusion layer comprises a titanium diffusion barrier.

In some embodiments, the thickness of the thin-film interlayer 110 is approximately greater than the thickness of the surface coating interlayer 120. In some embodiments, the thin-film interlayer 110 can have a thickness in a range of approximately 3 to 30 microns. In some embodiments, the surface coating interlayer 120 can have a thickness in a range of approximately 0.1 to 3 microns.

In some embodiments, the use of surface-coating 120 on a given substrate can mitigate some mechanical stress during the bonding process.

Figure 3:
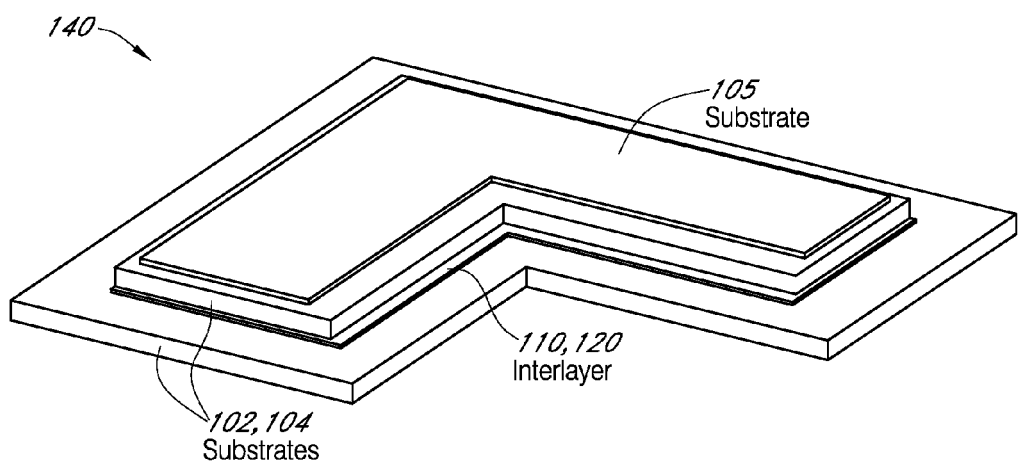
FIG. 3 illustrates a perspective view of one embodiment of bonding of the first and second substrates The first and second substrates independently comprise one of a semiconductor substrate, metal substrate, or metal-ceramic combination, the third substrate can comprise a semiconductor substrate, and the interlayer can comprise a metal.

FIG. 3 illustrates a perspective view of one embodiment of bonding of the first and second substrates. The first and second substrates 104, 102 independently comprise one of a semiconductor substrate, metal substrate, or metal-ceramic combination, the third substrate comprises a semiconductor substrate, and the interlayer comprises a metal. The surface-coating 120 and the thin-film 110 can be provided in any combination, as discussed above, in order to provide the interlayer functionality.

In some embodiments, metals that can be used for the first and second substrates 104, 102 include, but are not limited to, copper (Cu), molybdenum (Mo), tungsten (W), chrome, aluminum (Al), platinum-titanium (Pt—Ti), and combinations, such as CuMo, AlSiC.

In some embodiments, metals and ceramics which may be used for embodiments of the first and second substrates 102, 104 comprising metal-ceramic combinations include, but are not limited to, copper, molybdenum, tungsten, chrome, aluminum, platinum-titanium, alumina, and combinations such as Cu-Alumina-Cu known as 'Direct Copper Bonding or DCB', CuMo, AlSiC.

In some embodiments, semiconductors that can be used for the first, second, and third substrates 104, 102, 105 include, but are not limited to, silicon, sapphire, quartz, alumina, gallium arsenide, gallium nitride and III-V and II-VI semiconducting materials.

Figure 4:
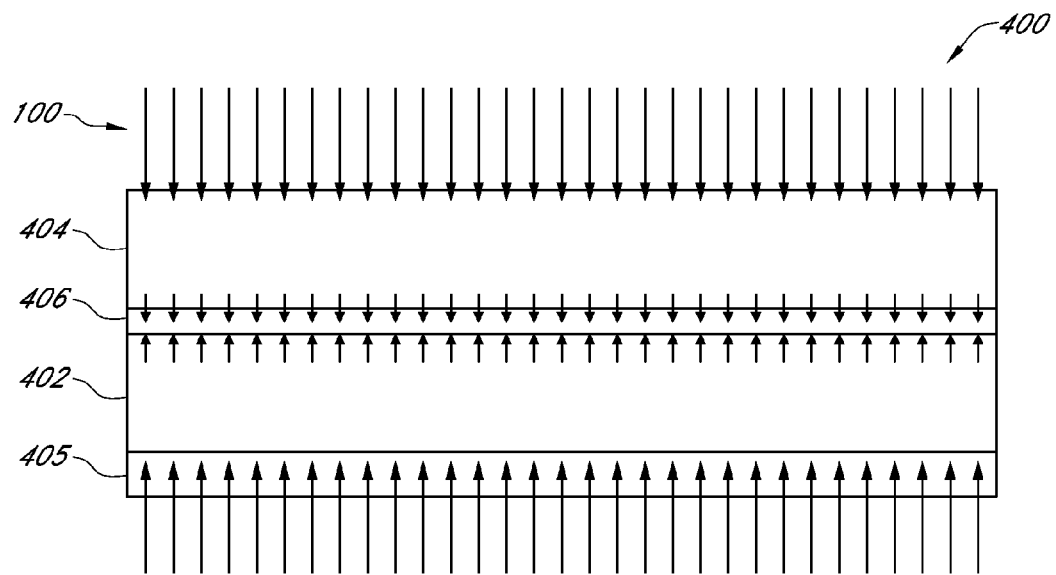
FIG. 4 shows that in one embodiment, the first and second substrates comprise metals. Microwave energy can be deposited unsubstantially in both of the first and second metal substrates, while much more substantially in the interlayer, and, in some embodiments, the third substrate. Heating of the interlayer occurs substantially faster than that of the metal substrates so as to allow bonding of the substrates without detrimental heating of the substrates.

FIG. 4 shows one embodiment of a substrate assembly 400 having a first substrate 404 a second substrate 402, and a third substrate 405, with an interlayer 406 interposed between the first and second substrates 404, 402. In certain embodiments, the third substrate 405 is a non-metal. In further embodiments, the third substrate 405 can absorb at least a portion of the microwave energy 100. As described above, the interlayer 406 can be heated to melting before the first and second substrates 404, 402 are heated to an undesirable level.

Figure 5:
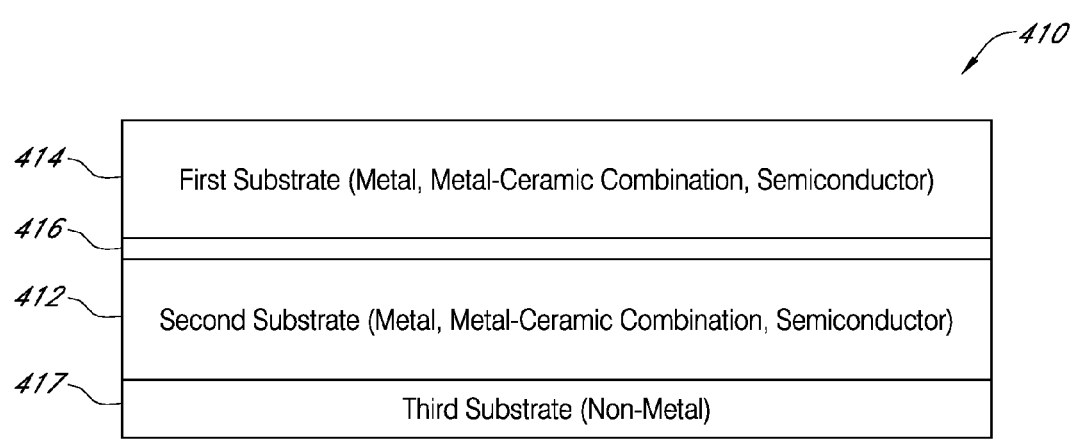
FIG. 5 shows that in one embodiment, the first and second substrates are independently selected from metals, metal-ceramic combinations, and semiconductors, while and the third substrate is selected from semiconductors and polymers.

FIG. 5 shows that in one embodiment 410, the first substrate (414 in FIG. 5) can be selected from a first metal, a first metal-ceramic combination, and a first semiconductor, while and the second substrate (412 in FIG. 5) is selected from a second metal, a second metal-ceramic combination, and a second semiconductor. The third substrate is selected from semiconductors and polymers. An appropriate interlayer 416 is shown to be interposed between the first and second substrates 414, 412.

In one embodiment, the first and second substrates 414, 412 comprise thick film metals, the third substrate 417 comprises a non-metal, such as a semiconductor, and the interlayer 416 comprises a metal. As discussed above, because the microwaves 100 do not penetrate the metal substrates significantly beyond their skin depth, the metal interlayer may be heated to melting without significant heating of the metal substrates. In one embodiment, the third semiconductor substrate absorbs at least a portion of the microwave energy 100 to facilitate heating of the interlayer 416. Thus, the bonding can be carried without significant expansion of the metal substrates, thereby reducing the likelihood of the development of residual stresses in the assembly 410.

In one embodiment, the first substrate 414 comprises a metal-ceramic combination, the second substrate 412 comprises a metal, the third substrate comprises a non-metal such as a semiconductor, and the interlayer 416 comprises a metal. In one embodiment, the metal-ceramic combination substrate comprises DCB (copper to alumina to copper) and the second metal substrate 412 comprises a copper substrate. In one embodiment, the semiconductor substrate absorbs at least a portion of the microwave energy 100 to facilitate heating of the interlayer 416. Thus, the bonding can be carried without significant expansion of the metal and metal-ceramic substrates, thereby reducing the likelihood of the development of residual stresses in the assembly 410.

In an alternative embodiment, the first and second substrates 414, 412 may be interchanged, with the first substrate 414 comprising a metal and the second substrate 412 comprising a metal-ceramic combination. The third substrate 417 and interlayer 416 still comprise a non-metal such as a semiconductor and a metal, respectively.

An example of an application where such configurations can be used is an insulated gate bipolar transistor (IGBT) structure formed in the high-power RF devices, and the combination substrate being bonded to the copper substrate to facilitate dissipation of heat. In one embodiment a device made of the IGBT substrate contains the electronics portion that generates the power and heat during normal operation of the device.

In a further embodiment, the first and second substrates 414, 412 comprise semiconductors, the third substrate comprises a polymer, and the interlayer comprises a solder. In one embodiment, the solder may comprise an AgSnCu solder which is substantially lead free. In one embodiment, the solder possesses a melting temperature of approximately 220° C. In one embodiment, the polymer may comprise a polymer possessing a low melting temperature, for example, approximately 120° C. Such polymers may include, but are not limited to polyimides. The polymer further does not substantially absorb microwaves.

An example of an application where such a configuration may be utilized is in solder reflow used in interconnects of electronic devices. In general, interconnects are regions where electrical components are bonded to conduction pathways, allowing information to be transmitted in and out of the electrical components. Bonding at interconnects is typically performed using a solder paste. After application of the solder paste, the solder paste is generally heated to cause the solder paste to flow and adopt a generally spherical configuration. This spherical configuration allows the solder to better adhere to the structure upon which the electrical components and conduction pathways are mounted, such as an underbump metallization.

These device structures are often covered, either partially or completely by a polymer substrate which functions as a packaging enclosure. However, these polymer packaging enclosures possess relatively low melting temperatures and may be degraded, deformed, or removed when bulk heating of the region surrounding the interconnect is performed to promote solder reflow.

Application of microwaves to the assembly 410 for solder reflow can mitigate this problem. The microwaves selectively heat the solder interlayer between the two semiconductors while without substantially heating the polymer packaging layer and cause the solder to adopt a generally spherical geometry.

Advantageously, this method of solder reflow provides significant flexibility in the processing of the assembly 410. The capability of performing solder reflow while the polymer packaging layer present allows the solder reflow to be performed after packaging, rather than before packaging. As a result, the number of fabrication steps may be reduced, providing a cost savings in the fabrication of the assembly 410.

Figure 6:
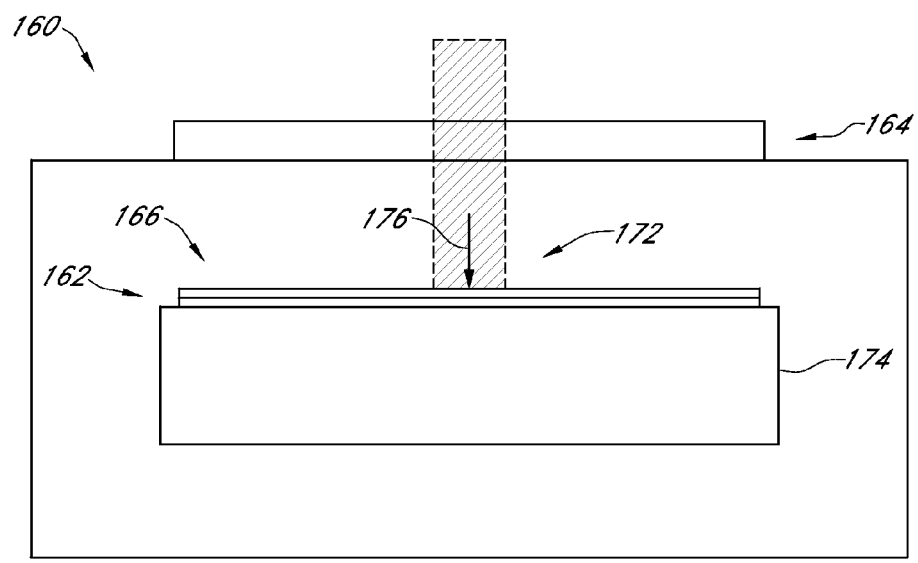
FIG. 6 shows one embodiment of a microwave bonding apparatus that defines a microwave cavity that facilitates exposure of the substrates to be bonded to the microwave energy, wherein the apparatus can include a support platform which can be introduced in the microwave cavity to support the substrates during the bonding process and also a pressure applicator that provides parts intimacy to the substrates being bonded.

FIG. 6 shows one embodiment of a bonding apparatus 160 that is configured to provide the microwave energy to a substrate assembly 162 being bonded. The substrate assembly 162 may comprises any of the substrate-interlayer-substrate configurations described herein.

In one embodiment, the bonding apparatus 160 defines a cavity 166 in which the substrate assembly 162 can be placed. The microwave energy 100 is provided to the substrate assembly 162 in the cavity 166 from a microwave generator 164. The microwave energy 100 may be transferred in a known manner, either directly or via a transferred assembly such as a waveguide.

FIG. 6 shows that, in one embodiment, the bonding apparatus 160 can include a platform 174 on which the substrate assembly 162 can be placed for the bonding process. The bonding apparatus 160 can also include a pressure applicator 172 that facilitates parts intimacy for the substrate assembly 162. In one embodiment, the pressure applicator 172 provides a force (arrow 176) along a direction having a component that is substantially perpendicular to a plane defined by one or more substrates of the substrate assembly 162.

In one embodiment, the platform 174 is formed from an insulator material such as quartz, so as to substantially reduce heat dissipation to the cavity. In one embodiment, the pressure applicator 172 is formed from a low microwave absorbing materials such as quartz, so as to allow application of pressure while reducing the disruption of the microwave energy being applied.

Figure 7:
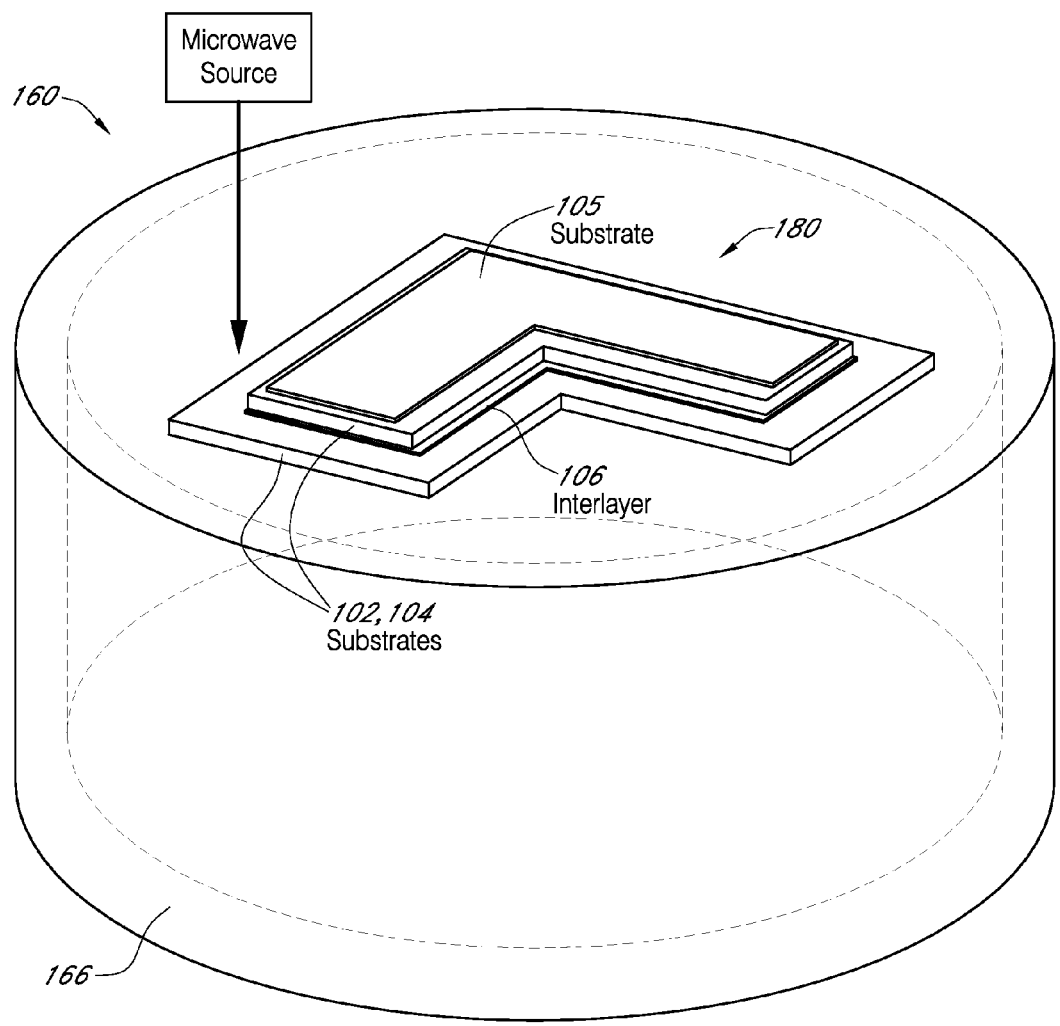
FIG. 7 illustrates that, in one embodiment, the microwave cavity can comprise a cylindrical cavity that facilitates application of substantially azimuthally symmetric microwave energy to the substrates.

In various embodiments, the microwave cavity 166 and the microwave energy 100 provided thereto can be implemented using known techniques. FIG. 7 show that, in one embodiment, the microwave cavity 166 is a generally cylindrical cavity. An example substrate assembly 180 is shown to be subjected to microwave energy from a microwave source.

In one embodiment, microwave radiation in a substantially single-mode condition is introduced into the cavity 166. In one embodiment, the example cylindrical cavity of FIG. 7 can have a diameter of approximately 12.7 cm, and can be excited by a substantially azimuthally symmetric $TM_{010}$ mode signal at a frequency of about 2.2 GHz. The loaded Q value of the empty cavity may be approximately 2500.

In certain preferred embodiments, the substrate assembly 180 is placed at an area of the cavity 166 so that perturbation of a selected mode of the microwave in the cavity 166 is kept to a minimum. In one embodiment, the selected mode is a normal mode within the cavity, and such mode is preferably perturbed as little as possible.

In one bonding application, a metal-ceramic substrate hosting an electronics device (the second substrate 102) having a dimension of approximately 4×4 $mm^2$ can be bonded to a larger sized copper substrate (the first substrate 104). It is contemplated, however, that substrates smaller and larger than the foregoing example can be bonded. For example, first and second substrates 104, 102 having dimensions between approximately ¼ inch and 3 inches can be bonded. It will be understood, however, that the sizes of the devices do not limit the implementation of the various techniques of the present disclosure.

In some embodiments, microwave energy can be applied to the substrate assembly 180 in the cavity 166 using one of a number of power-time profiles. Some of these profiles can have relatively high power delivered during relatively short times, while some profiles use the opposite. Different time-power profiles can be used with different materials and sizes of the substrates and/or the interlayer, and/or the position of such assembly 180 in the cavity 166.

In an example power profile that can be applied to the example setup of FIGS. 6 and 7, approximately 100 watts of microwave power may be applied for approximately 40-60 seconds.

In another example profile, approximately 90 watts of microwave power can be applied for approximately 2-3 minutes to achieve a gradient heating and cooling profile.

As described above, a pressure applicator 172 can be used to provide parts intimacy for the substrate assembly 180. In some embodiments, a force applied by the pressure applicator can be measured and monitored. With such monitoring, the melting of a bonding material between the two substrates can be detected. For example, when the bonding material melts, that region gives in to the applied pressure, and the measured force undergoes a relatively sudden reduction.

Although the above-disclosed embodiments have shown, described, and pointed out the fundamental novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the claims of one or more applications that follow this application.

What is claimed is:

1. A method for bonding substrates, comprising:
   providing a first substrate, a second substrate, and a third substrate, at least one of the substrates comprising a semiconductor substrate having an integrated circuit;
   providing a first interlayer between the first and second substrates;
   providing a second interlayer between the second and third substrates;
   providing microwave energy so that at least a portion of the microwave energy is absorbed by the first and second interlayers to thereby raise the temperature of the first interlayer faster than the temperatures of the first and second substrates to melt the first interlayer to facilitate bonding of the first and second substrates and raise the temperature of the second interlayer faster than the temperatures of the second and third substrates to melt the second interlayer to facilitate bonding of the second and third substrates;

wherein at least one of the first and second interlayers comprises a thin-film metal layer having a heat capacity less than those associated with its respective substrates, and is not attached to its respective substrates prior to the providing of microwave energy.

2. The method of claim 1, wherein each of the first and second interlayers comprises a thin-film metal layer having a heat capacity less than that of its respective substrates.

3. The method of claim 1, wherein the each of the first and second interlayers is not attached its respective substrates prior to the providing of microwave energy.

4. The method of claim 1, wherein one of the first and second interlayers comprises a surface coating formed on at least one of its respective substrates.

5. The method of claim 1, wherein the first and second substrates are independently selected from metals, metal-ceramic combinations, and semiconductors.

6. The method of claim 1, wherein the third substrate is selected from semiconductors and polymers.

7. The method of claim 1, further comprising providing a force that facilitates parts intimacy for at least the first and second substrates with the first interlayer interposed there between.

8. The method of claim 7, further comprising monitoring the force so as to allow detection of a melt point of the first interlayer.

* * * * *